(12) United States Patent
Koepp et al.

(10) Patent No.: US 8,511,569 B1
(45) Date of Patent: Aug. 20, 2013

(54) RFID INTEGRATED CIRCUIT TO STRAP MOUNTING SYSTEM

(75) Inventors: Ronald L. Koepp, Seattle, WA (US); Harley K. Heinrich, Snohomish, WA (US); Christopher J. Diorio, Shoreline, WA (US)

(73) Assignee: Impinj, Inc., Seattle, WA (US)

( * ) Notice: Subject to any disclaimer, the term of this patent is extended or adjusted under 35 U.S.C. 154(b) by 252 days.

(21) Appl. No.: 13/069,171

(22) Filed: Mar. 22, 2011

Related U.S. Application Data

(63) Continuation-in-part of application No. 12/938,092, filed on Nov. 2, 2010.

(51) Int. Cl.
*H01L 23/02* (2006.01)

(52) U.S. Cl.
USPC ........................ 235/492; 438/121; 257/686

(58) Field of Classification Search
CPC ............................................... G06K 19/07749
USPC ......... 235/492, 380; 257/686; 343/700 MS; 438/121
See application file for complete search history.

(56) References Cited

U.S. PATENT DOCUMENTS

| | | | |
|---|---|---|---|
| 2004/0183182 A1* | 9/2004 | Swindlehurst et al. | ....... 257/686 |
| 2005/0035924 A1 | 2/2005 | Liu et al. | |
| 2005/0134506 A1* | 6/2005 | Egbert | ............ 343/700 MS |
| 2009/0269886 A1 | 10/2009 | Yamazaki et al. | |
| 2010/0127084 A1* | 5/2010 | Pavate et al. | ............ 235/492 |
| 2010/0308118 A1 | 12/2010 | Kataya et al. | |

OTHER PUBLICATIONS

Non-Final Office Action U.S. Appl. No. 12/938,092 mailed Nov. 15, 2012.

* cited by examiner

*Primary Examiner* — Thien T Mai
(74) *Attorney, Agent, or Firm* — Turk IP Law, LLC

(57) ABSTRACT

A nonconductive, organic stabilization layer deposited on an RFID IC provides a consistent and predictable mounting distance between the RFID IC and its antenna layer or a strap, thereby ensuring a consistent and predictable mounting capacitance between circuits of the RFID IC and an antenna formed on the inlay or the strap. Openings in the stabilization layer enable electrical connection between the antenna pads of the RFID IC and the terminals of the inlay antenna or strap contacts through bumps formed on the antenna pads, through a conductive redistribution layer formed on the stabilization layer (when the inlay or strap is attached to the RFID IC by means of an anisotropic conductive layer), or through a capacitive connection to the inlay antenna or strap (when the inlay or strap is attached to the RFID IC by means of a nonconductive layer).

20 Claims, 17 Drawing Sheets

*SIGNAL PATH DURING R→T*

*SIGNAL PATH DURING T→R*

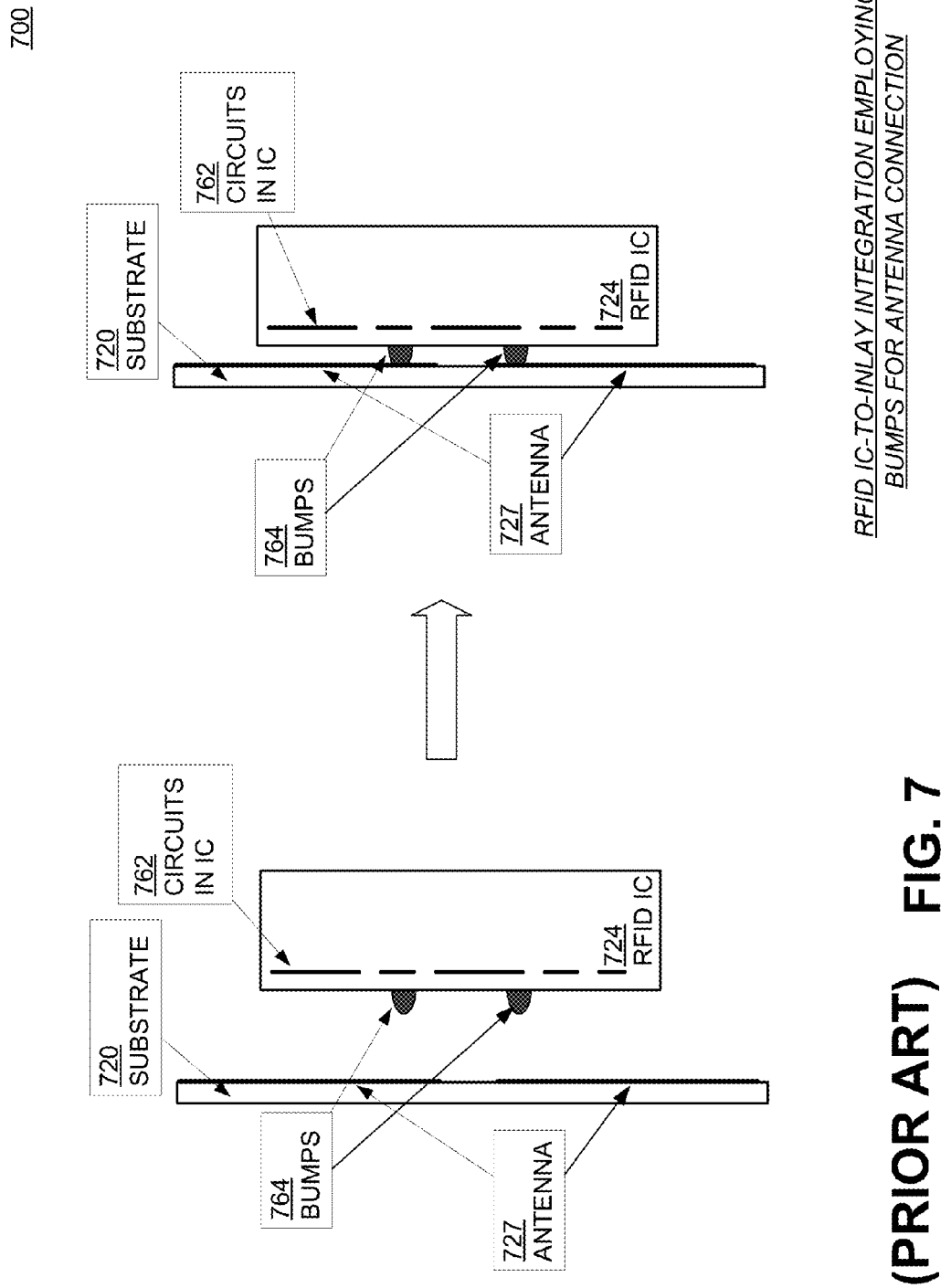

RFID INTEGRATED CIRCUIT TO STRAP MOUNTING SYSTEM

CROSS REFERENCE TO RELATED APPLICATIONS

This application is a continuation-in-part of U.S. patent application Ser. No. 12/938,092 filed on Nov. 2, 2010. The disclosures of the foregoing patent application are hereby incorporated by reference for all purposes.

BACKGROUND

Radio Frequency Identification (RFID) systems typically include RFID tags and RFID readers. RFID readers are also known as RFID reader/writers or RFID interrogators. RFID systems can be used in many ways for locating and identifying objects to which the tags are attached. RFID systems are particularly useful in product-related and service-related industries for tracking objects being processed, inventoried, or handled. In such cases, an RFID tag is usually attached to an individual item, or to its package.

In principle, RFID techniques entail using an RFID reader to interrogate one or more RFID tags. The reader transmitting a Radio Frequency (RF) wave performs the interrogation. The RF wave is typically electromagnetic, at least in the far field. The RF wave can also be predominantly electric or magnetic in the near field.

A tag that senses the interrogating RF wave responds by transmitting back another RF wave. The tag generates the transmitted back RF wave either originally, or by reflecting back a portion of the interrogating RF wave in a process known as backscatter. Backscatter may take place in a number of ways.

The reflected-back RF wave may further encode data stored internally in the tag, such as a number. The response is demodulated and decoded by the reader, which thereby identifies, counts, or otherwise interacts with the associated item. The decoded data can denote a serial number, a price, a date, a destination, other attribute(s), any combination of attributes, and so on.

An RFID tag typically includes an antenna and an RFID integrated circuit (IC) including a radio section, a power management section, and frequently a logical section, a memory, or both. In some RFID tags the power management section employs an energy storage device, such as a battery. RFID tags with an energy storage device are known as active or battery-assisted tags. Advances in semiconductor technology have miniaturized the electronics so much that an RFID tag can be powered solely by the RF signal it receives. Such RFID tags do not include an energy storage device such as a battery, and are called passive tags. Regardless of the type, all tags typically store or buffer some energy temporarily in passive storage devices such as capacitors.

In a typical RFID manufacturing process, RFID ICs are manufactured on semiconductor wafers. The RFID ICs are diced from the wafer and then attached to antennas, typically formed on a substrate. The substrate and antenna (together an inlay), and IC together comprise the RFID tag. The IC is electrically coupled to the antenna by pressing the IC onto the antenna such that bumps formed on antenna connections of the RFID IC establish a connection to the antenna. Pick and place machines pick an IC, position it on the antenna, and press the two together.

Optionally, RFID ICs may first be attached to a strap with a strap substrate and one or more strap pads, where the antenna pads of the ICs are electrically coupled to the strap pad(s). The strap itself may then be placed onto an inlay with an antenna such that the strap pad(s) (and therefore the antenna pads of the IC) are electrically coupled to the antenna. In these embodiments, the IC, strap, and inlay together comprise the RFID tag.

In some instances the machines may not apply consistent force during the attachment process. Variations in the force may result in differing mounting distances between the RFID IC and the antenna, which in turn causes a mounting capacitance between the RFID IC and the antenna to vary from tag to tag. The mounting capacitance affects the performance of the RFID tag. Tags with different mounting capacitance have undesired performance variations in RFID applications.

BRIEF SUMMARY

This summary is provided to introduce a selection of concepts in a simplified form that are further described below in the Detailed Description. This summary is not intended to identify key features or essential features of the claimed subject matter, nor is it intended as an aid in determining the scope of the claimed subject matter.

Embodiments are directed to RFID tags and methods of manufacturing RFID tags employing a stabilization layer for consistent and predictable mounting distance between an RFID IC and its antenna layer or a strap. A nonconductive, organic stabilization layer with a predefined thickness is formed over the RFID IC. Openings are formed in the stabilization layer for antenna connections. According to some embodiments, bumps may be formed on the RFID IC over the antenna connections such that the bumps establish electrical connection between the RFID circuits and the antenna layer or strap contacts when an inlay including the antenna layer or a strap with strap contacts is pressed against the RFID IC. The stabilization layer ensures consistent mounting distance between the antenna layer/strap contacts and the RFID circuits resulting in consistent and predictable distributed capacitance between the two, thereby producing tags with substantially similar performance characteristics.

These and other features and advantages will be apparent from a reading of the following detailed description and a review of the associated drawings. It is to be understood that both the foregoing general description and the following detailed description are explanatory only and are not restrictive of aspects as claimed.

BRIEF DESCRIPTION OF THE DRAWINGS

The following Detailed Description proceeds with reference to the accompanying drawings, in which:

FIG. 7 illustrates RFID IC-to-inlay integration employing bumps for the antenna connection.

DETAILED DESCRIPTION

In the following detailed description, references are made to the accompanying drawings that form a part hereof, and in which are shown by way of illustration specific embodiments or examples. These embodiments or examples may be combined, other aspects may be utilized, and structural changes may be made without departing from the spirit or scope of the present disclosure. The following detailed description is therefore not to be taken in a limiting sense, and the scope of the present invention is defined by the appended claims and their equivalents.

Figure 1:
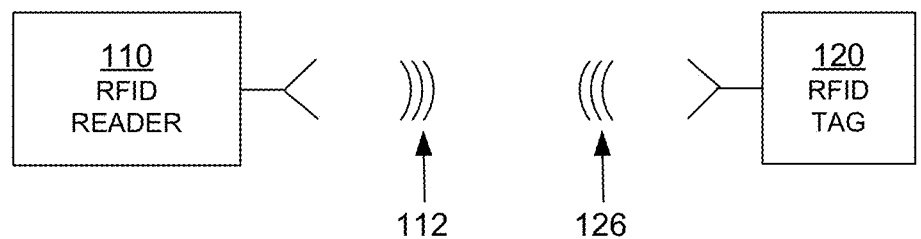
FIG. 1 is a block diagram of components of an RFID system.

FIG. 1 is a diagram of components of a typical RFID system 100, incorporating embodiments. An RFID reader 110 transmits an interrogating Radio Frequency (RF) wave 112. RFID tag 120 in the vicinity of RFID reader 110 may sense interrogating RF wave 112 and generate wave 126 in response. RFID reader 110 senses and interprets wave 126.

Reader 110 and tag 120 exchange data via wave 112 and wave 126. In a session of such an exchange each encodes, modulates, and transmits data to the other, and each receives, demodulates, and decodes data from the other. The data can be modulated onto, and demodulated from, RF waveforms. The RF waveforms are typically in a suitable range of frequencies, such as those near 900 MHz, 2.4 GHz, and so on.

Encoding the data can be performed in a number of ways. For example, protocols are devised to communicate in terms of symbols, also called RFID symbols. A symbol for communicating can be a delimiter, a calibration symbol, and so on. Further symbols can be implemented for ultimately exchanging binary data, such as "0" and "1", if that is desired. In turn, when the symbols are processed internally by reader 110 and tag 120, they can be equivalently considered and treated as numbers having corresponding values, and so on.

Tag 120 can be a passive tag, or an active or battery-assisted tag (i.e., having its own power source). Where tag 120 is a passive tag, it is powered from wave 112.

Figure 2:
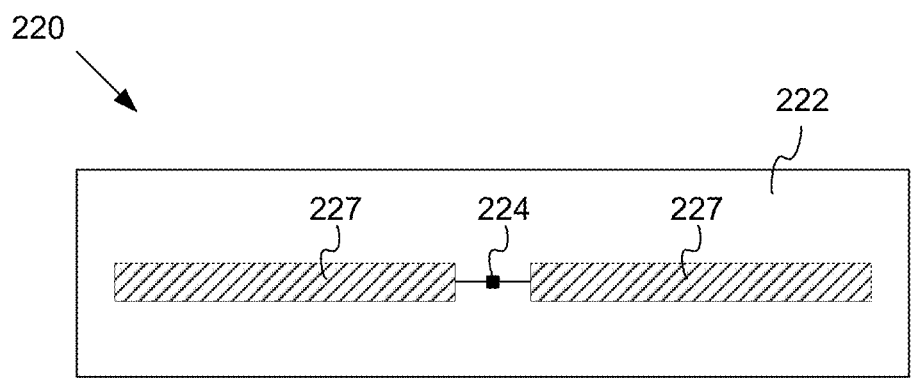
FIG. 2 is a diagram showing components of a passive RFID tag, such as a tag that can be used in the system of FIG. 1.

FIG. 2 is a diagram of an RFID tag 220, which can be the same as tag 120 of FIG. 1. Tag 220 is implemented as a passive tag, meaning it does not have its own power source. Much of what is described in this document, however, applies also to active and battery-assisted tags.

Tag 220 is formed on a substantially planar inlay 222, which can be made in many ways known in the art. Tag 220 includes an electrical circuit which is preferably implemented as an integrated circuit (IC) 224 (also referred to as chip). IC 224 is arranged on inlay 222.

Tag 220 also includes an antenna for exchanging wireless signals with its environment. The antenna is usually flat and formed on inlay 222. IC 224 is electrically coupled to the antenna via suitable antenna connections (not shown in FIG. 2).

The antenna may be made in a number of ways, as discussed in more detail below. In the example of FIG. 2, the antenna is made from two distinct antenna segments 227, which are shown here forming a dipole. Many other embodiments are possible, using any number of antenna segments.

In some embodiments, an antenna can be made with even a single segment. Different points of the segment can be coupled to one or more of the antenna connections of IC 224. For example, the antenna can form a single loop, with its ends coupled to the terminals. It should be remembered that, when the single segment has more complex shapes, even a single segment could behave like multiple segments at the frequencies of RFID wireless communication.

In operation, a signal is received by the antenna and communicated to IC 224. IC 224 both harvests power, and responds if appropriate, based on the incoming signal and the IC's internal state. In order to respond by replying, IC 224 modulates the reflectance of the antenna, which generates backscatter 126 from wave 112 transmitted by the reader. Coupling together and uncoupling the antenna connections of IC 224 can modulate the antenna's reflectance, as can a variety of other means.

In the embodiment of FIG. 2, antenna segments 227 are separate from IC 224. In other embodiments, antenna segments may alternatively be formed on IC 224, and so on. Furthermore, an interface element may be used to couple the IC 224 to the antenna segments 227 (not shown in FIG. 2).

Figure 3:
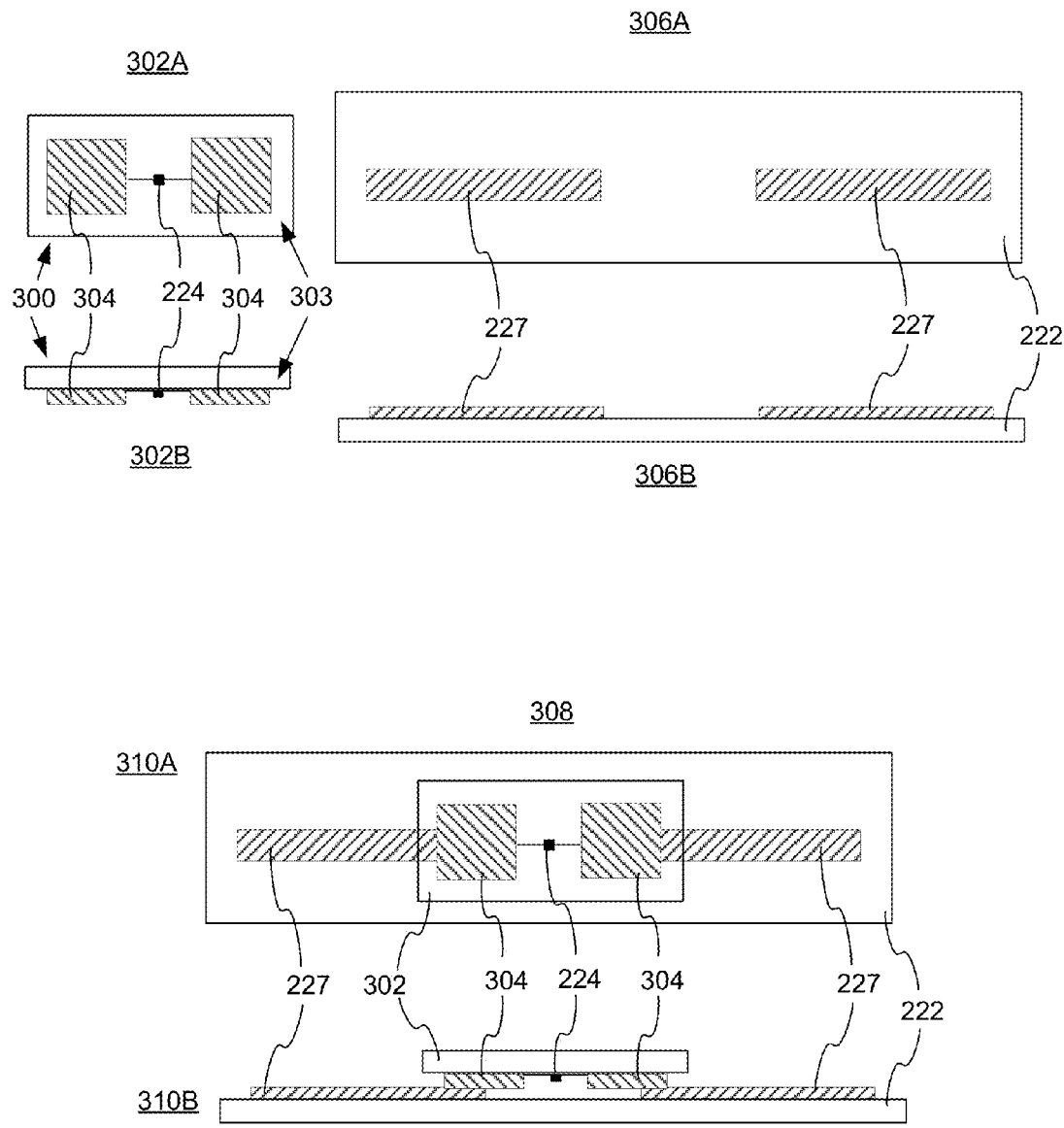
FIG. 3 is a diagram showing components of an alternative passive RFID tag with strap and inlay that can be used in the system of FIG. 1.

FIG. 3 is a diagram of top and side views of an alternative RFID tag 308, which can be the same as tag 120 of FIG. 1. Tag 308, like tag 220, is implemented as a passive tag. Tag 308 includes an inlay 222, an IC 224, and antenna segments 227, each of which are similar to the corresponding elements in tag 220 described in FIG. 2

Tag 308 is formed from two components: a substantially planar strap 300 (top view 302A, bottom view 302B) and the inlay 222 (top view 306A, bottom view 306B). The strap 300 includes a strap substrate 303 and strap contacts 304, which may be flat and formed directly on the strap substrate 303. The IC 224 is mounted on the strap 300 such that antenna contacts/pads on the IC 224 electrically couple/connect with the strap contacts 304 via suitable contact couplings/connections (not shown in FIG. 3).

In order to form the tag 308 (top view 310A, side view 310B), the strap 300 containing the IC 224 and the strap contacts 304 is placed on the inlay 222 such that the strap contacts 304 (and therefore antenna contacts/pads on the IC 224) are electrically coupled to the antenna segments 227 on the inlay 222. The strap 300 may be affixed to the inlay 222 via pressing, an interface layer, one or more adhesives, or any other suitable means for securing the strap 300 to the inlay 222.

The components of the RFID system of FIG. 1 may communicate with each other in any number of modes. One such mode is called full duplex. Another such mode is called half-duplex, and is described below.

Figure 4:
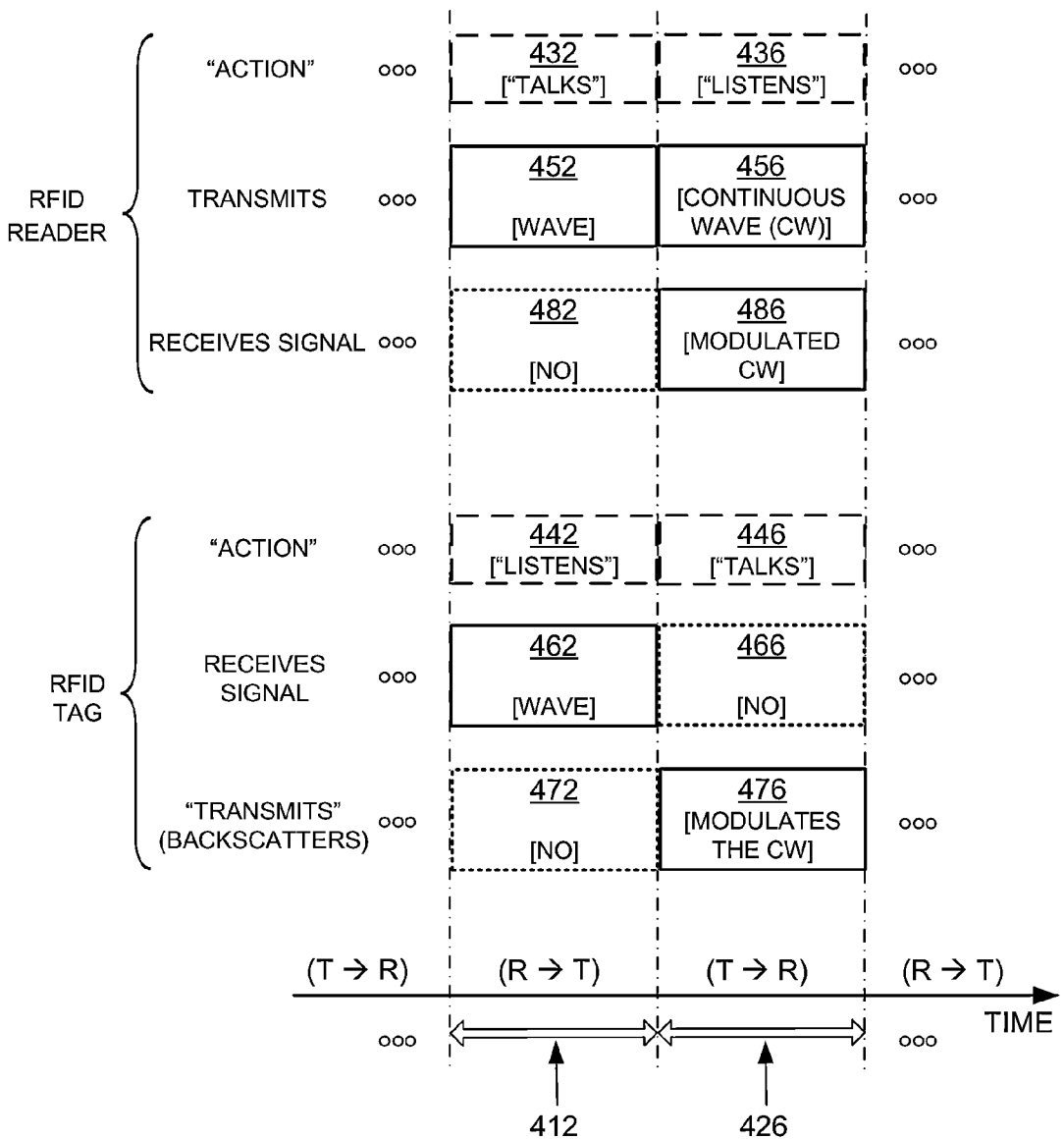
FIG. 4 is a conceptual diagram of communication in an RFID system for explaining a half-duplex mode of communication between the components of the RFID system of FIG. 1.

FIG. 4 is a conceptual diagram 400 for explaining the half-duplex mode of communication between the components of the RFID system of FIG. 1, especially when tag 120 is implemented as passive tag 220 of FIG. 2. The explanation is made with reference to a TIME axis, and also to a human metaphor of "talking" and "listening". The actual technical implementations for "talking" and "listening" are now described.

RFID reader 110 and RFID tag 120 talk and listen to each other by taking turns. As seen on axis TIME, when reader 110 talks to tag 120 the communication session is designated as "R→T", and when tag 120 talks to reader 110 the communication session is designated as "T→R". Along the TIME axis, a sample R→T communication session occurs during a time interval 412, and a following sample T→R communication session occurs during a time interval 426. Of course interval 412 is typically of a different duration than interval 426— here the durations are shown approximately equal only for purposes of illustration.

According to blocks 432 and 436, RFID reader 110 talks during interval 412, and listens during interval 426. According to blocks 442 and 446, RFID tag 120 listens while reader 110 talks (during interval 412), and talks while reader 110 listens (during interval 426).

In terms of actual technical behavior, during interval 412, reader 110 talks to tag 120 as follows. According to block 452, reader 110 transmits wave 112, which was first described in FIG. 1. At the same time, according to block 462, tag 120 receives wave 112 and processes it, to extract data and so on. Meanwhile, according to block 472, tag 120 does not backscatter with its antenna, and according to block 482, reader 110 has no wave to receive from tag 120.

During interval 426, tag 120 talks to reader 110 as follows. According to block 456, reader 110 transmits a Continuous Wave (CW), which can be thought of as a carrier signal that ideally encodes no information. As discussed before, this carrier signal serves both to be harvested by tag 120 for its own internal power needs, and also as a wave that tag 120 can backscatter. Indeed, during interval 426, according to block 466, tag 120 does not receive a signal for processing. Instead, according to block 476, tag 120 modulates the CW emitted according to block 456, so as to generate backscatter wave 126. Concurrently, according to block 486, reader 110 receives backscatter wave 126 and processes it.

Figure 5:
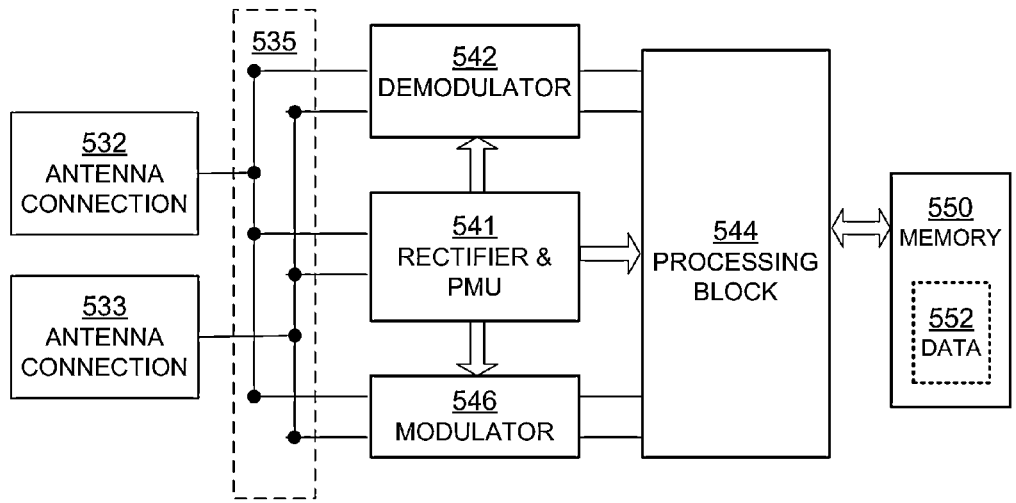
FIG. 5 is a block diagram showing the RFID tag components, such as the one shown in FIG. 1.

FIG. 5 is a block diagram showing a detail of an RFID IC, such as the one shown in FIG. 2. Electrical circuit 524 in FIG. 5 may be formed in an IC of an RFID tag, such as IC 224 of FIG. 2. Circuit 524 has a number of main components that are described in this document. Circuit 524 may have a number of additional components from what is shown and described, or different components, depending on the exact implementation.

Circuit 524 includes at least two antenna connections 532, 533, which are suitable for coupling to one or more antenna segments (not shown in FIG. 5). Antenna connections 532, 533 may be made in any suitable way, such as using pads, bumps, and so on. In a number of embodiments more than two antenna connections are used, especially in embodiments where more antenna segments are used.

Circuit 524 includes a section 535. Section 535 may be implemented as shown, for example as a group of nodes for proper routing of signals. In some embodiments, section 535 may be implemented otherwise, for example to include a receive/transmit switch that can route a signal, and so on.

Circuit 524 also includes a Rectifier and PMU (Power Management Unit) 541. Rectifier and PMU 541 may be implemented in any way known in the art, for harvesting raw RF energy received via antenna connections 532, 533. In some embodiments, block 541 may include more than one rectifier.

In operation, an RF wave received via antenna connections 532, 533 is received by Rectifier and PMU 541, which in turn generates power for the electrical circuits of IC 524. This is true for either or both reader-to-tag (R→T) and tag-to-reader (T→R) sessions, whether or not the received RF wave is modulated.

Circuit 524 additionally includes a demodulator 542. Demodulator 542 demodulates an RF signal received via antenna connections 532, 533. Demodulator 542 may be implemented in any way known in the art, for example including an attenuator stage, an amplifier stage, and so on.

Circuit 524 further includes a processing block 544. Processing block 544 receives the demodulated signal from demodulator 542, and may perform operations. In addition, it may generate an output signal for transmission.

Processing block 544 may be implemented in any way known in the art. For example, processing block 544 may include a number of components, such as a processor, memory, a decoder, an encoder, and so on.

Circuit 524 additionally includes a modulator 546. Modulator 546 modulates an output signal generated by processing block 544. The modulated signal is transmitted by driving antenna connections 532, 533, and therefore driving the load presented by the coupled antenna segment or segments. Modulator 546 may be implemented in any way known in the art, for example including a driver stage, amplifier stage, and so on.

In one embodiment, demodulator 542 and modulator 546 may be combined in a single transceiver circuit. In another embodiment, modulator 546 may include a backscatter transmitter or an active transmitter. In yet other embodiments, demodulator 542 and modulator 546 are part of processing block 544.

Circuit 524 additionally includes a memory 550, which stores data 552. Memory 550 is preferably implemented as a Nonvolatile Memory (NVM), which means that data 552 is retained even when circuit 524 does not have power, as is frequently the case for a passive RFID tag.

In terms of processing a signal, circuit 524 operates differently during a R→T session and a T→R session. The different operations are described below, in this case with circuit 524 representing an IC of an RFID tag.

Figure 6A:
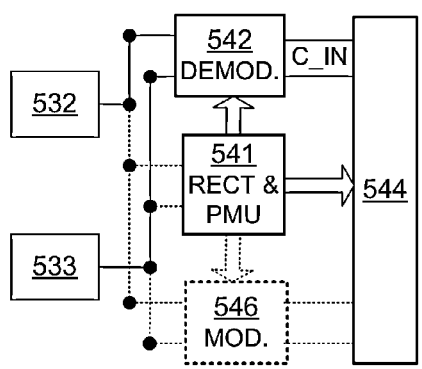
FIGS. 6A and 6B illustrate signal paths during reader-to-tag and tag-to-reader communications in the block diagram of FIG. 5.

FIG. 6A shows version 624-A of components of circuit 524 of FIG. 5, further modified to emphasize a signal operation during a R→T session (receive mode of operation) during time interval 412 of FIG. 4. An RF wave is received by antenna connections 532, 533; a signal is demodulated by demodulator 542; and the demodulated signal is input to processing block 544 as C_IN. In one embodiment, C_IN may include a received stream of symbols.

Version 624-A shows as relatively obscured those components that do not play a part in processing a signal during a R→T session. Indeed, Rectifier and PMU 541 may be active, but only in converting raw RF power. And modulator 546 generally does not transmit during a R→T session. Modulator 546 typically does not interact with the received RF wave significantly, either because switching action in section 535 of FIG. 5 decouples the modulator 546 from the RF wave, or by designing modulator 546 to have a suitable impedance, and so on.

While modulator 546 is typically inactive during a R→T session, it need not be always the case. For example, during a R→T session, modulator 546 could be active in other ways. For example, it could be adjusting its own parameters for operation in a future session.

Figure 6B:
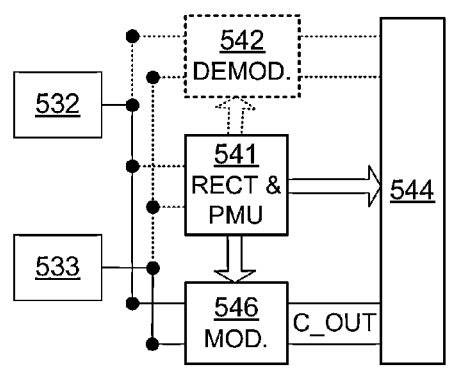

FIG. 6B shows version 624-B of components of circuit 524 of FIG. 5, further modified to emphasize a signal operation during a T→R session during time interval 426 of FIG. 4. A signal is output from processing block 544 as C_OUT. In one embodiment, C_OUT may include a stream of symbols for transmission. C_OUT is then modulated by modulator 546, and output as an RF wave via antenna connections 532, 533.

Version 624-B shows as relatively obscured those components that do not play a part in processing a signal during a T→R session. Indeed, Rectifier and PMU 541 may be active, but only in converting raw RF power. And demodulator 542 generally does not receive during a T→R session. Demodulator 542 typically does not interact with the transmitted RF wave, either because switching action in section 535 decouples the demodulator 542 from the RF wave, or by designing demodulator 542 to have a suitable impedance, and so on.

While demodulator 542 is typically inactive during a T→R session, it need not be always the case. For example, during a T→R session, demodulator 542 could be active in other ways. For example, it could be adjusting its own parameters for operation in a future session.

FIG. 7 illustrates RFID IC-to-inlay integration employing bumps for the antenna connections.

In a typical RFID tag manufacturing process, RFID ICs (e.g. RFID IC 724) are manufactured as part of a wafer. Each RFID IC 724 includes circuits 762. Circuits 762 may include any of the RFID circuitry discussed above. An inlay for the RFID tag includes substrate 720 and antennas 727. Antennas 727 may be formed on substrate 720 by various methods. Antennas 727 can be electrically coupled to circuits 762 by various methods. One such method is illustrated in diagram 700. Bumps 764 are formed on (or attached to) antenna connections (e.g. pads) of the RFID IC 724. The inlay may then be pressed onto the RFID IC such that electrical contact between circuits 762 and antennas 727 is established through the bumps 764.

The integration of RFID ICs and corresponding inlays is typically done using pick and place machines, which automatically pick RFID IC 724, position the RFID IC 724, and press the RFID IC 724 and the inlay antenna 727 together. A suitable adhesive material may be used for permanent attachment of the two components. One challenge with this manufacturing method is that the mounting force for pressing the two components together may vary from tag-to-tag. Machines with greater mounting-force accuracy are often more expensive and slower, which adds to the RFID tag cost.

Figure 8:
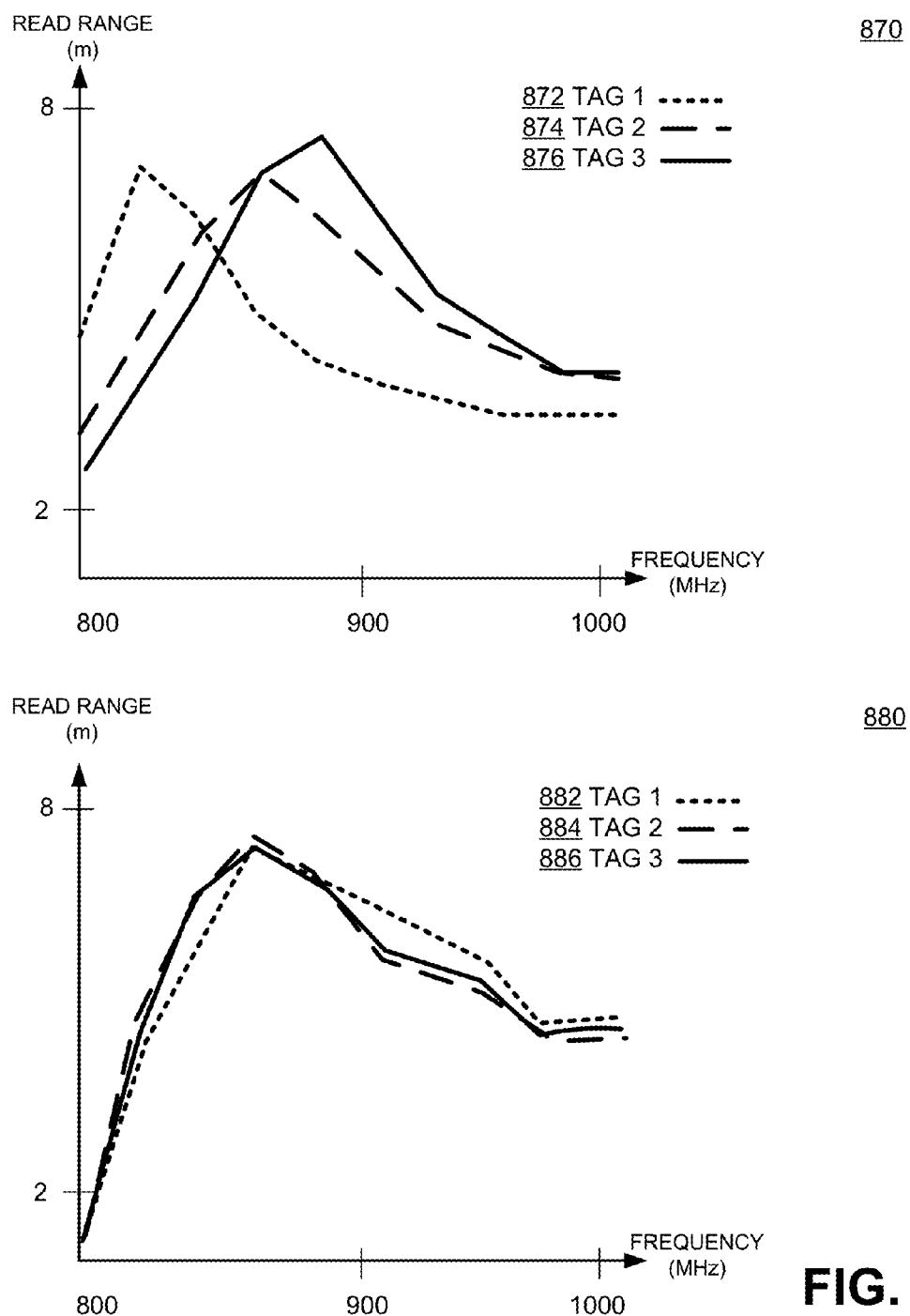
FIG. 8 illustrates example tag read range performance shifts in the presence and absence of mounting distance variations.

FIG. 8 illustrates example tag frequency-shift diagrams 870 and 880, in the presence and absence of mounting-force variations, respectively.

The RFID circuits and the antennas discussed above in conjunction with FIG. 7 form a tuned circuit. The tuning is dependent on the mounting capacitance between the antennas and the RFID circuits as discussed below. Thus, circuit characteristics, and thereby the RFID tag's performance, may be impacted by the assembly process. For example, mounting force variations during the pick-and-place steps may result in varying distances between the RFID circuits and the antennas, which in turn results in different mounting capacitance values.

RFID tags with different capacitance between their antennas and their circuits have dissimilar performance characteristics. Diagram 870 illustrates the frequency response of three example tags (872, 874, and 876) that have dissimilar mounting capacitance, plotted as read range versus frequency. Despite the RFID ICs being from the same wafer, the peak of each tag's read range occurs at different frequencies. Frequency response is an important feature of RFID tags. Tags whose useful read range falls outside a desired frequency band may be unusable. Other tags that are tuned within the desired frequency band but have degraded read range (not shown in FIG. 8) may likewise be unusable.

Diagram 880 illustrates the frequency-response characteristics of three other example tags (882, 884, and 886) having substantially similar mounting capacitance, which results in substantially similar frequency-response characteristics. Tags with similar performance have higher quality, and systems that use these tags have better performance.

Figure 9:
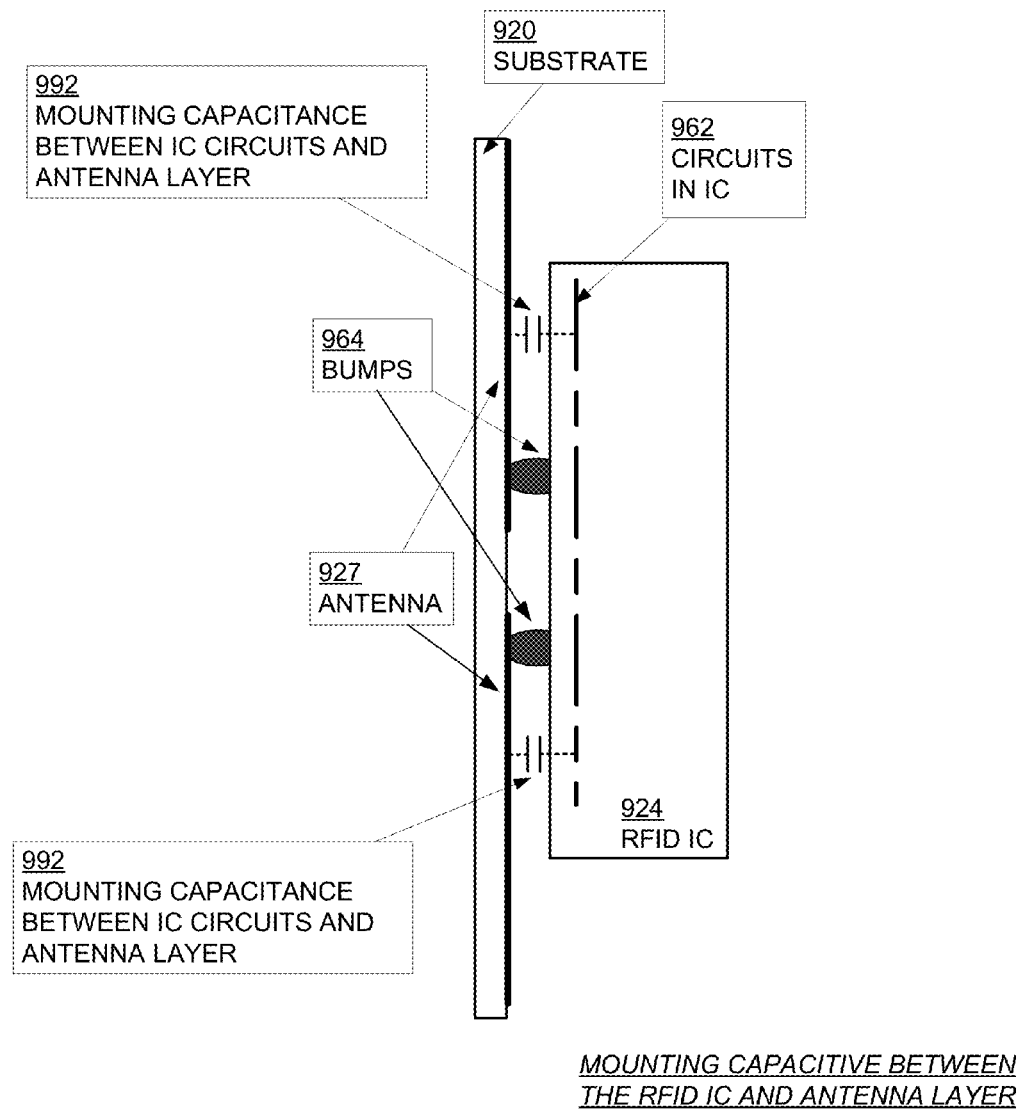
FIG. 9 illustrates the mounting capacitance formed between the circuits of an RFID IC and an antenna layer.

FIG. 9 illustrates the mounting capacitance formed between the circuitry of an RFID IC and the antenna layer in an RFID tag.

Diagram 900 includes RFID IC 924 with embedded circuits 962 and an RFID inlay comprising substrate 920 and antennas 927. Antenna 927 may be a dipole, slot, monopole, microstrip, stripline, or any other type of antenna as is known in the art.

Bumps 964 form an electrical connection between antenna 927 and circuits 962. When the IC is mounted onto the inlay the circuits 962 are typically separated from antenna 927 by an air gap or an underfill. This gap is the insulator in the mounting capacitance 992 formed between circuits 962 and antenna 927.

The value of this mounting capacitance is quantified as:

$$C = \varepsilon_0 \varepsilon_r \frac{A}{d} \qquad [1]$$

where $\varepsilon_o$ is the free-space permittivity, $\varepsilon_r$ is the relative permittivity, A is the area of the overlap between the antenna layer and the circuits, and d is the distance between the antenna layer and the circuits. The area A typically varies by only a small amount, both because pick-and-place machines usually place the RFID IC onto the inlay with good placement accuracy, and because the overlap is approximately constant even if the IC is not placed accurately because this capacitance is distributed over the entire area of the IC-to-antenna overlap. The distance, d, however can change significantly with the mounting force applied during the mounting process, causing the capacitance C to change significantly with it.

Figure 10:
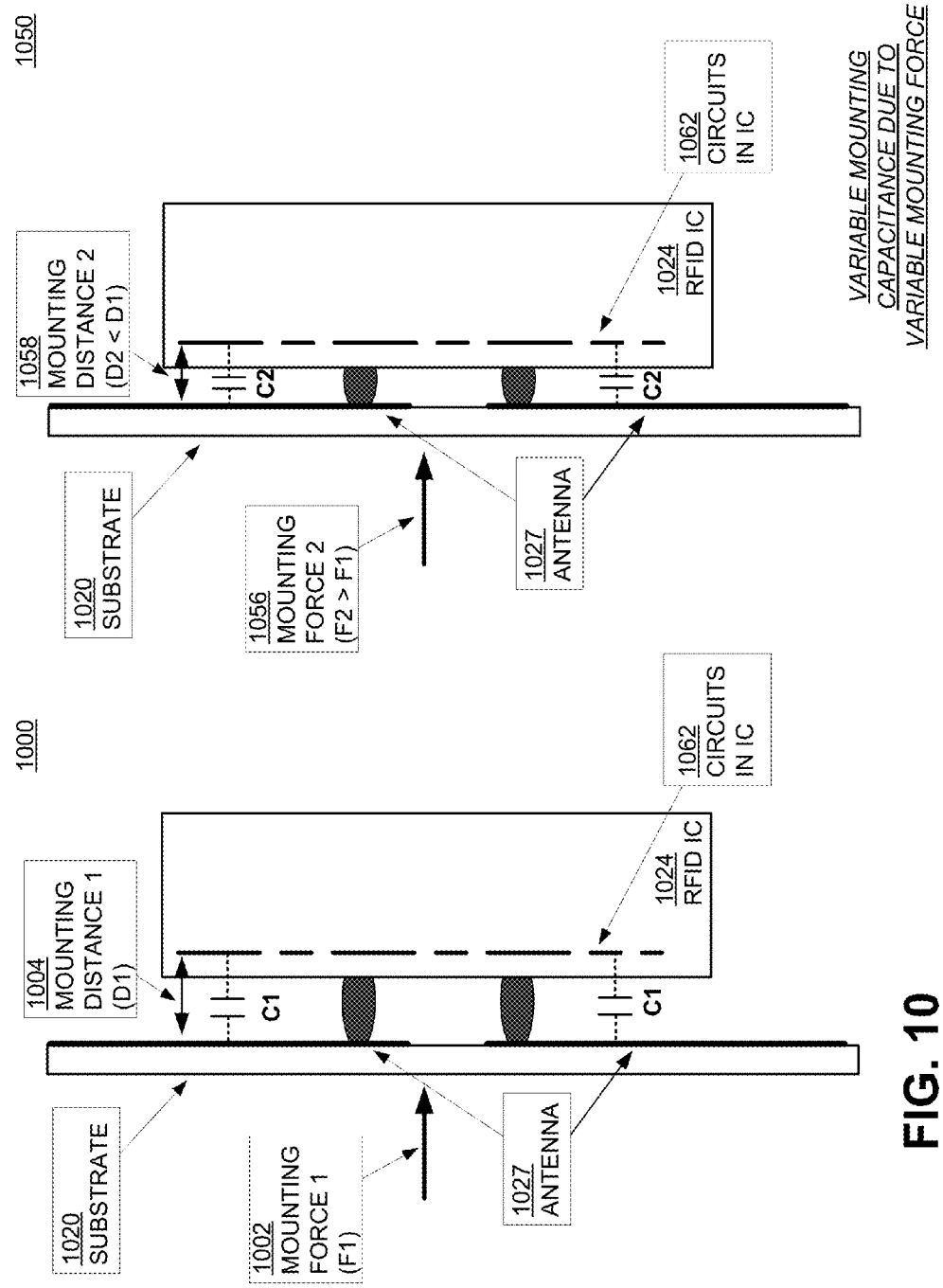
FIG. 10 illustrates variable mounting capacitance, between the IC and antenna layer, due to variable mounting force and consequent variable mounting distance.

FIG. 10 illustrates the variation in mounting capacitance between the circuitry of an RFID IC 1062 and an antenna layer based on varying mounting force.

In the example of diagram 1000, the inlay comprising substrate 1020 and antennas 1027 is pressed against RFID IC 1024 with a mounting force F1 (1002). This force causes mounting distance D1 (1004) between the antennas 1027 and circuits 1062. Distance D1 corresponds to d in the equation for mounting capacitance C following formula [1] above and results in a mounting capacitance C1.

In the example of diagram 1050, the inlay is pressed against RFID IC 1024 with a mounting force F2 (1056) which is larger than mounting force F1 (1002). The larger mounting force causes a mounting distance D2 (1058) between the antennas 1027 and circuits 1062 which is smaller than the mounting distance D1. The smaller distance D2 produces a mounting capacitance C2 which is larger than C1 by formula [1] above.

The different mounting distances D1 and D2 result in different mounting capacitances C1 and C2 and, consequently, differently tuned RFID tags with different performance characteristics.

Figure 11:
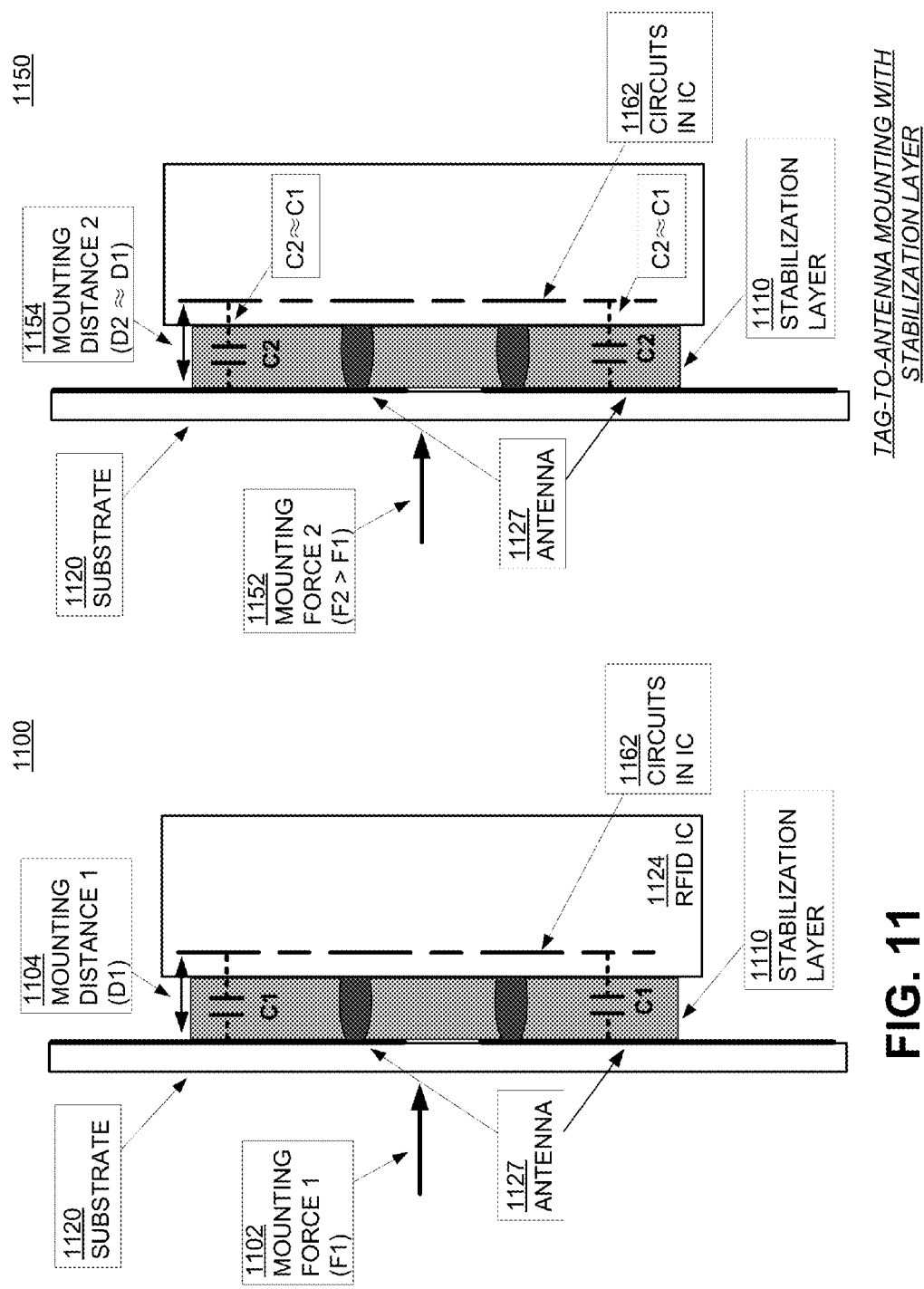
FIG. 11 illustrates tag antenna mounting with the stabilization layer, and shows how mounting capacitance between the IC and the antenna layer can be rendered independent of mounting force by employing a stabilization layer in an RFID IC according to embodiments.

FIG. 11 illustrates how the mounting capacitance between the IC circuitry and the antenna layer in an RFID tag can be made independent of IC mounting force by placing a nonconductive stabilization layer between the IC and the inlay antenna. This stabilization layer ensures a constant mounting distance despite variable mounting force during tag integration. This constant mounting distance mitigates the variation in mounting capacitance with mounting force. A reduced variation in mounting capacitance, in turn, ensures predictable and consistent tag frequency response without requiring pick-and-place machines to maintain precise mounting force.

Diagram 1100 shows an example RFID inlay comprising substrate 1120 and antenna 1127 being pressed against RFID IC 1124 with a mounting force F1 (1102), where the antenna is separated from the IC by stabilization layer 1110. Mounting distance D1 (1104) is fixed by stabilization layer 1110, producing a similarly fixed mounting capacitance C1 by formula [1].

Diagram 1150 shows the RFID inlay being pressed against the RFID IC with a mounting force F2 (1152) which is larger than mounting force F1. The presence of stabilization layer 1110 ensures that mounting distance D2 (1154) is substantially the same as mounting distance D1 (1104) despite the larger mounting force F2. As a result, mounting capacitance C2 is substantially similar to mounting capacitance C1 by formula [1], helping ensure that the tags have similar tuning and therefore similar performance characteristics.

Stabilization layer 1110 physically contacts substrate 1120 and antenna 1127. Bumps formed through openings in the stabilization layer electrically connect circuits 1162 to antenna 1127. Stabilization layer 1110 may be an organic material, typically (although not necessarily) with a relatively low dielectric constant and a reasonable thickness to provide small capacitance valued by formula [1]. In some embodiments, the dielectric constant of the stabilization layer may be less than 3.9 and the thickness may exceed 1 μm. Examples of organic materials include but are not limited to polyimide-based materials, Spheron™ WLP manufactured by RoseStreet Labs, LLP based in Phoenix, Ariz., or benzocyclobutene-based materials (e.g., bisbenzocyclobutene, BCB). Anisotropic conductive adhesive or patterned conductive adhesive material may be applied onto stabilization layer 1110 to securely attach the RFID IC to the inlay.

Figure 12:
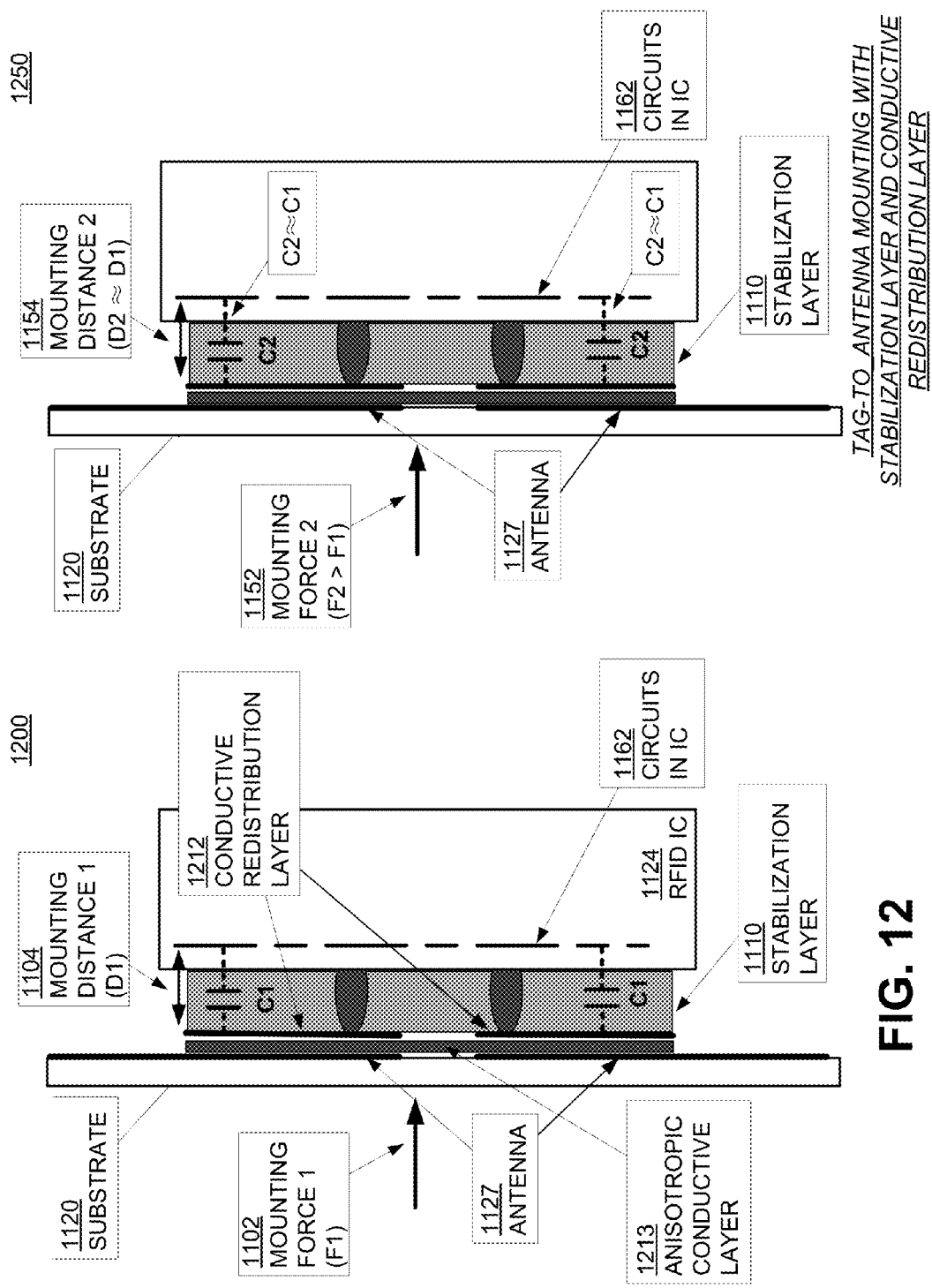
FIG. 12 illustrates tag antenna mounting with a stabilization layer and a conductive redistribution layer, and how the mounting capacitance between the IC and the antenna layer can be rendered independent of mounting force by employing a stabilization layer, a conductive redistribution layer, and an anisotropic conductive layer between the redistribution layer and the antenna layer in an RFID tag according to embodiments.

FIG. 12 illustrates how the mounting capacitance between an RFID IC and an antenna layer can be rendered independent of mounting force using a nonconductive stabilization layer, a conductive redistribution layer, and an anisotropic conductive layer in an RFID tag according to embodiments.

Diagram 1200 illustrates RFID IC 1124 with an additional conductive redistribution layer 1212 and an anisotropic conductive layer 1213. Like for the tags of FIG. 11, a stabilization layer 1110 ensures that the mounting distance D1 (1104) is essentially independent of mounting force F1 (1102). Different from the tags of FIG. 11, those of FIG. 12 include a conductive redistribution layer 1212 which substantially covers the surface of RFID IC 1124, and an anisotropic conductive layer between redistribution layer 1212 and antenna 1127. The conductive redistribution layer 1212 provides both a well-characterized capacitance C1 between the circuits of RFID IC 1162 and the redistribution layer itself, and a reliable electrical connection to the antenna pads of RFID IC 1124 via the connecting bumps. Anisotropic conductive layer 1213 ensures a reliable electrical contact between redistribution layer 1212 and antenna 1127.

As shown in diagram 1250, the mounting distance D2 (1154) due to mounting force F2 (1152) remains substantially the same as D1 (1104) in diagram 1200 despite the fact that F2>F1. The conductive redistribution layer 1212, which is formed on stabilization layer 1110, further ensures that capacitances C1 and C2 are, for all practical purposes, independent of mounting force, because C1 and C2 are formed between the IC circuits and the redistribution layer rather than between the IC circuits and the antenna. Furthermore, because capacitances C1 and C2 are formed between the circuits of the RFID IC and conductive redistribution layer 1212, which is in turn formed on stabilization layer 1110, even placement offsets between the RFID IC and antenna 1127 do not affect the mounting capacitance significantly.

Figure 13:
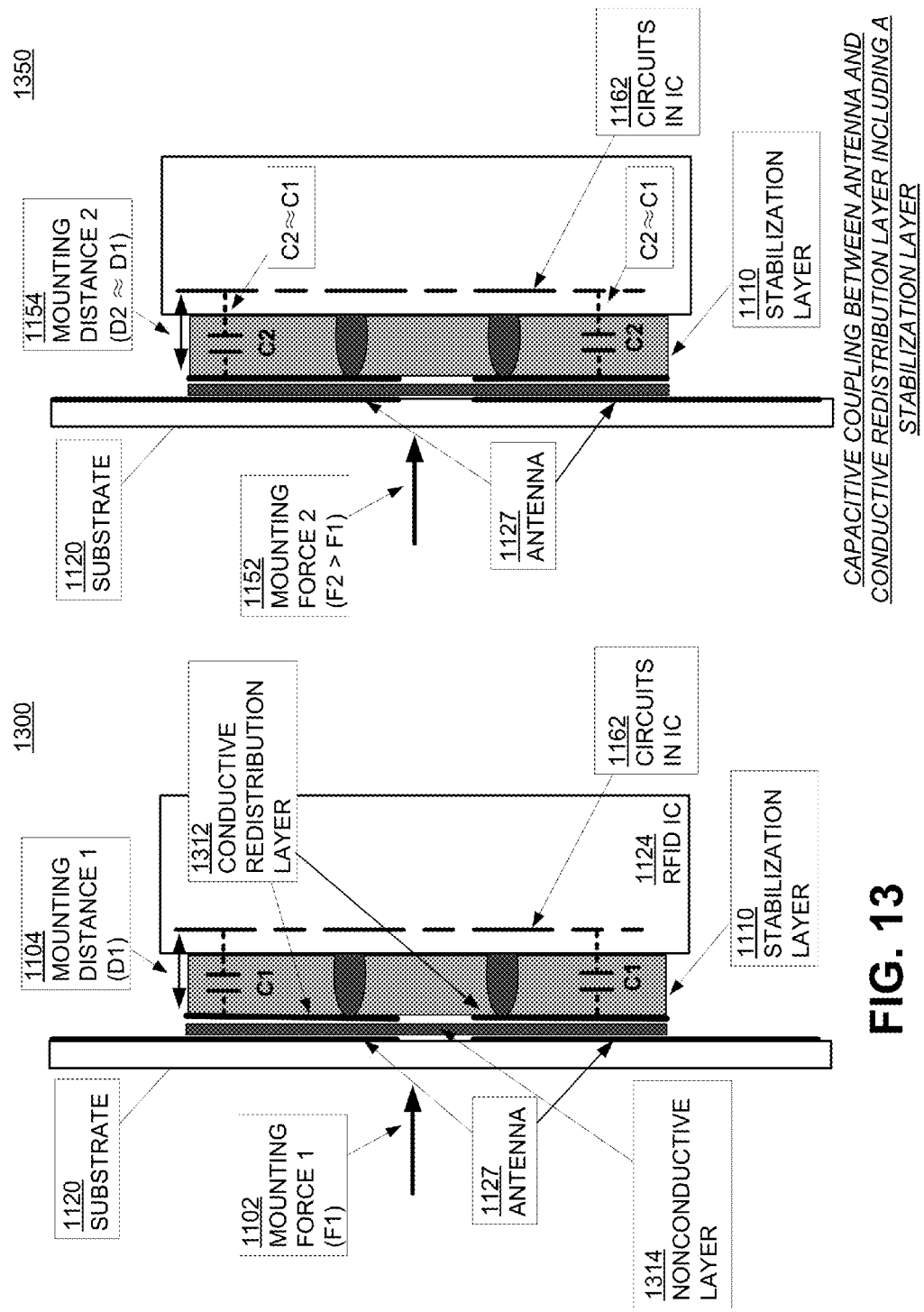
FIG. 13 illustrates tag antenna mounting with a stabilization layer and a conductive redistribution layer, and how the mounting capacitance between the IC and the antenna layer can be rendered independent of mounting force by employing a stabilization layer, a conductive redistribution layer, and by capacitively coupling the redistribution layer to the antenna layer in an RFID tag according to embodiments.

FIG. 13 illustrates how a mounting capacitance between an RFID IC and an antenna layer can be rendered independent of mounting force using a nonconductive stabilization layer, a conductive redistribution layer, and a further nonconductive layer in an RFID tag according to embodiments.

Diagram 1300 illustrates RFID IC 1124 including a conductive redistribution layer 1312 and a nonconductive layer 1314. Like for the tags of FIG. 11, stabilization layer 1110 ensures that mounting distance D1 (1104) is essentially independent of mounting force F1 (1102). Different from the tags of FIG. 11, those of FIG. 13 include a conductive redistribution layer 1312 formed on the stabilization layer 1110 which substantially covers the surface of RFID IC 1124, and a nonconductive layer between redistribution layer 1312 and antenna 1127. The conductive redistribution layer 1212 provides both a well-characterized capacitance C1 between the circuits of RFID IC 1124 and the redistribution layer itself, and a reliable electrical contact to the antenna pads of RFID IC 1124 via the connecting bumps. The nonconductive layer provides a capacitive connection between redistribution layer 1312 and the antenna 1127, which at the typical frequencies of RFID communications provided a low-impedance connection between the redistribution layer and the antenna.

As shown in diagram 1350, the mounting distance D2 (1154) due to mounting force F2 (1152) remains substantially the same as D1 (1104) in diagram 1300 despite the fact that F2>F1. The conductive redistribution layer formed on stabilization layer 1110 further ensures that the capacitances C1 and C2 are, for all practical purposes, independent of mounting force. Furthermore, because the capacitances C1 and C2 are formed between the circuits of the RFID IC and the conductive redistribution layer, which is in turn formed on stabilization layer 1110, even placement offsets between the RFID IC and antenna 1127 do not affect the mounting capacitance significantly.

Embodiments also include methods. Some are methods of manufacturing an RFID tag. Others are methods for controlling the manufacturing of an RFID tag. These methods can be implemented in any number of ways, including using the structures described in this document. One such way is by machine operations, of devices of the type described in this document. Another way is for one or more of the individual operations to be performed by one or more human operators. These human operators need not be collocated with each other, but each can be with a machine that performs a portion of a program or operation.

Figure 14:
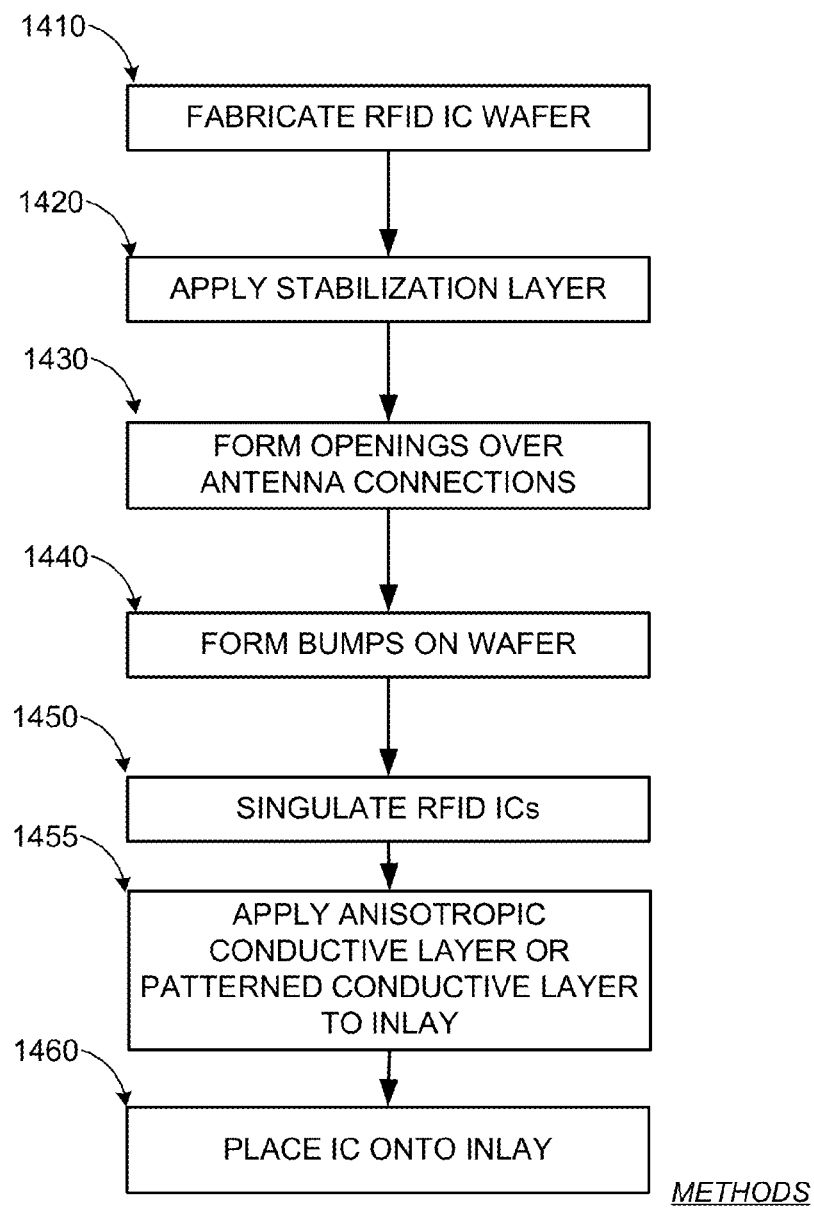
FIG. 14 is a flowchart for a process of fabricating an RFID tag with a stabilization layer according to some embodiments.

FIG. 14 is a flowchart for a process of fabricating an RFID tag including a stabilization layer according to embodiments.

Process 1400 begins with operation 1410, where an RFID wafer is fabricated. An RFID wafer includes a plurality of ICs as described above. At operation 1420, a stabilization layer is applied to the wafer. As one example, the wafer may be coated with an organic material. At operation 1430, openings are formed over the antenna connections of the ICs of the wafer, typically using techniques such as masking and etching.

At operation 1440, bumps are formed on the antenna connections. At operation 1450, the RFID ICs are singulated (i.e. separated from each other) by one or more of mechanical sawing, laser dicing, annealing and breaking, or any other of the other methods known in the art. At operation 1460, an anisotropic conductive layer or patterned conductive layer is applied to the inlay. At operation 1470, the ICs are pressed onto inlays, which include a substrate and a patterned antenna as described above. As mentioned previously, an optional adhesive material may be applied to the surface of the stabilization layer before attaching the RFID ICs to the inlays. According to some embodiments, the order of operations 1450 and 1460 may be reversed, where the anisotropic conductive layer or patterned conductive layer is applied to the inlay first followed by singulation of the RFID ICs.

Figure 15:
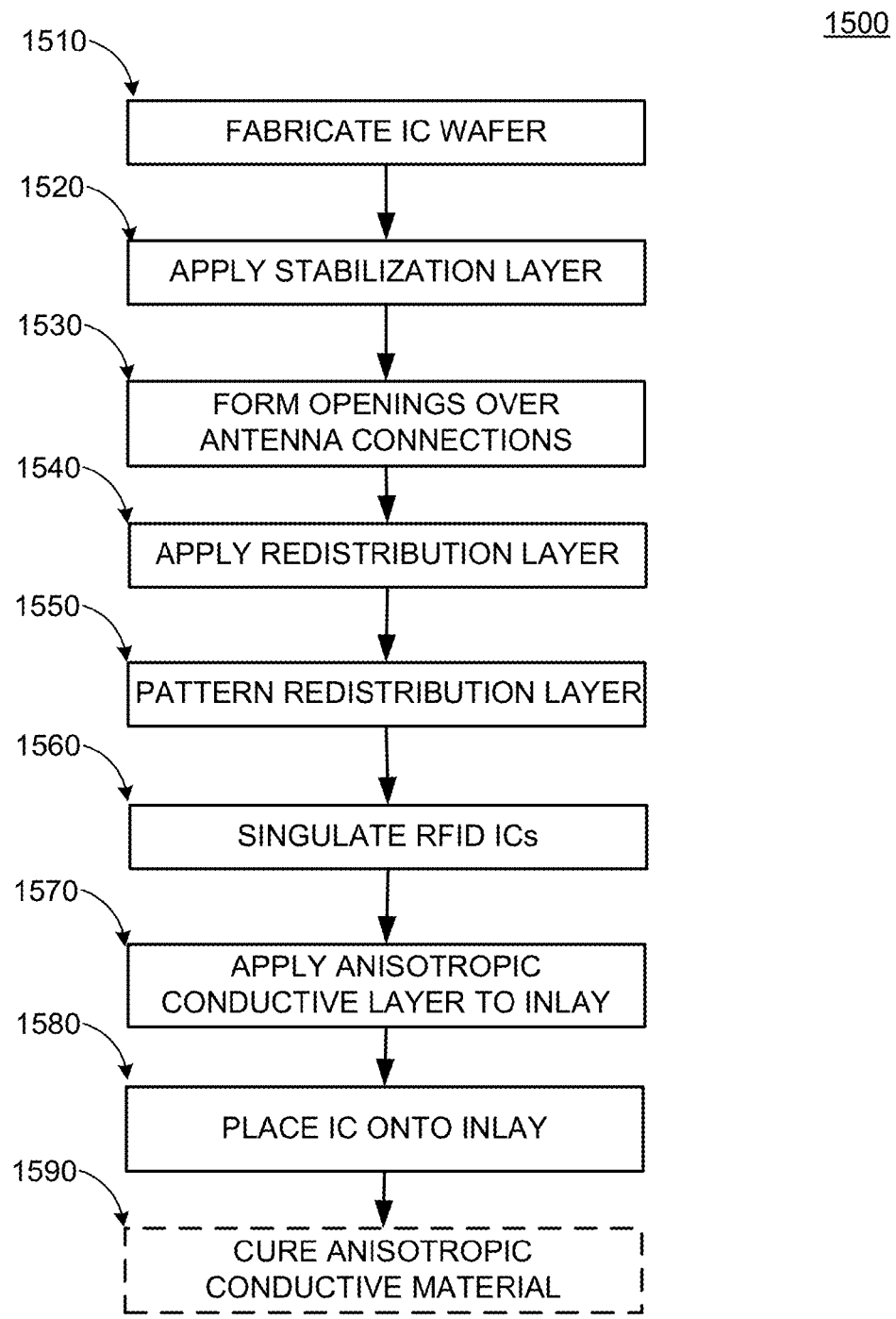
FIG. 15 is a flowchart for a process of fabricating an RFID tag with a stabilization layer, a conductive redistribution layer, and an anisotropic layer according to embodiments.

FIG. 15 is a flowchart for a process of fabricating an RFID tag with a stabilization layer, a conductive redistribution layer, and an anisotropic layer according to embodiments.

Process 1500 begins similarly to process 1400 of FIG. 14. First, at operation 1510, an RFID wafer is fabricated. At operation 1520, a stabilization layer is applied to the wafer. At operation 1530, openings are formed over the antenna connections of the ICs of the wafer. At operation 1540 a redistribution layer is applied on top of the stabilization layer. For the purposes of FIG. 15, this redistribution layer is presumed to make electrical contact with the antenna pads, although quite clearly a bumping step like operation 1440 could precede the redistribution layer. At operation 1550 the redistribution layer is patterned to form conductive regions of proper shape and size.

At operation 1560, the RFID ICs are singulated from the wafer. At operation 1570 an anisotropic conductive layer is applied to the inlay. At operation 1580 the ICs are placed onto inlays. At optional operation 1590 the anisotropic conductive material is cured (if it wasn't cured already).

Figure 16:
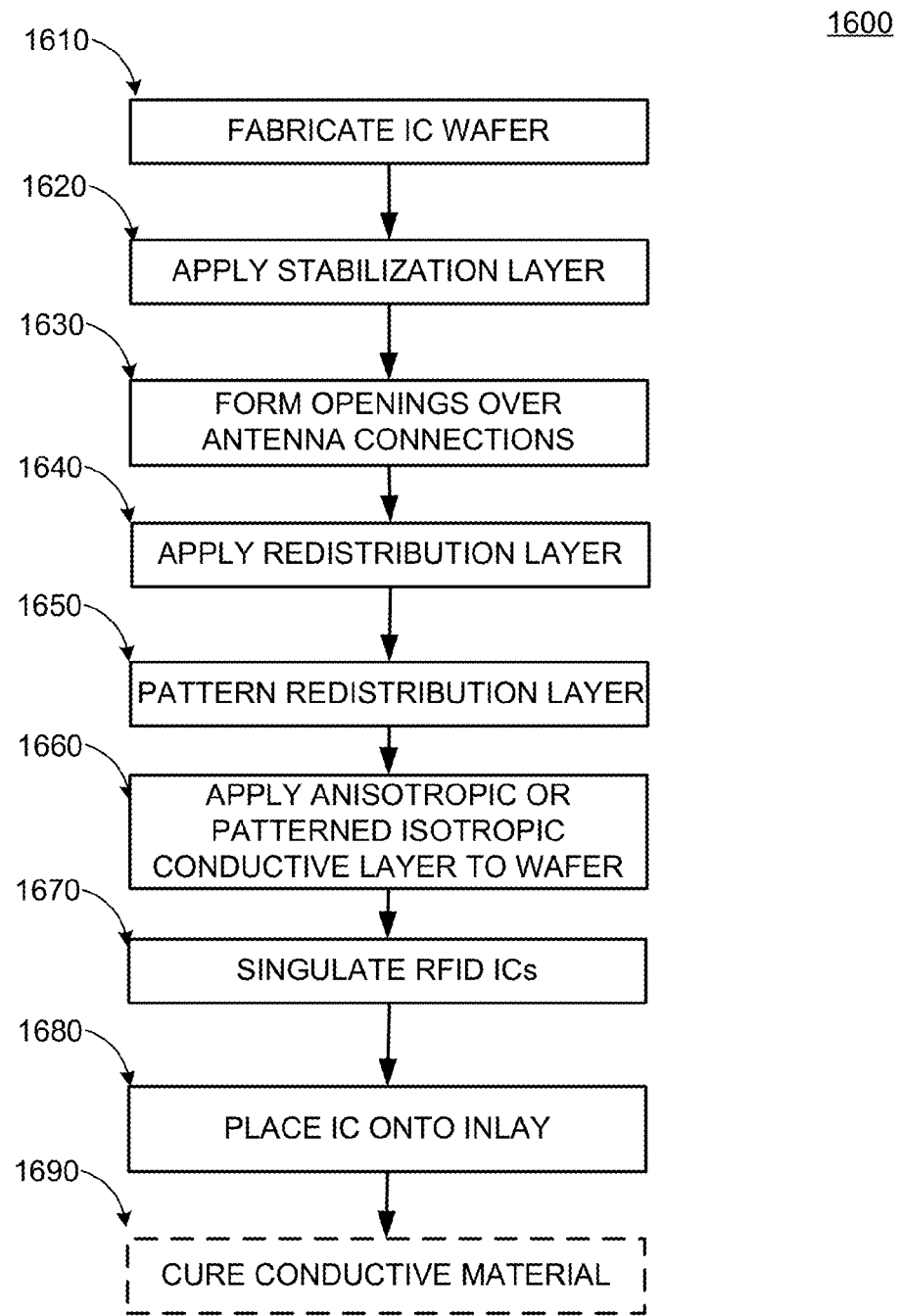
FIG. 16 is a flowchart for a process of fabricating an RFID tag with a stabilization layer, a conductive redistribution layer, and an anisotropic layer according to further embodiments.

FIG. 16 is a flowchart for a process of fabricating an RFID tag with a stabilization layer, a conductive redistribution layer, and an anisotropic layer according to further embodiments.

Process 1600 begins similarly to process 1500 of FIG. 15. First, at operation 1610, an RFID wafer is fabricated. At operation 1620, a stabilization layer is applied to the wafer. At operation 1630, openings are formed over the antenna connections of the ICs of the wafer. At operation 1640 a redistribution layer is applied on top of the stabilization layer. For the purposes of FIG. 16, this redistribution layer is presumed to make electrical contact with the antenna pads, although quite clearly a bumping step like operation 1440 could precede the redistribution layer. At operation 1650 the redistribution layer is patterned to form conductive regions of proper shape and size.

Differently from process 1500, an anisotropic or patterned isotropic layer is applied to the wafer at operation 1660, then at operation 1670 the RFID ICs are singulated from the wafer. Finally, at operation 1680 the ICs are placed onto inlays, and at optional operation 1690 the anisotropic or patterned isotropic conductive material is cured (if it wasn't cured already).

Figure 17:
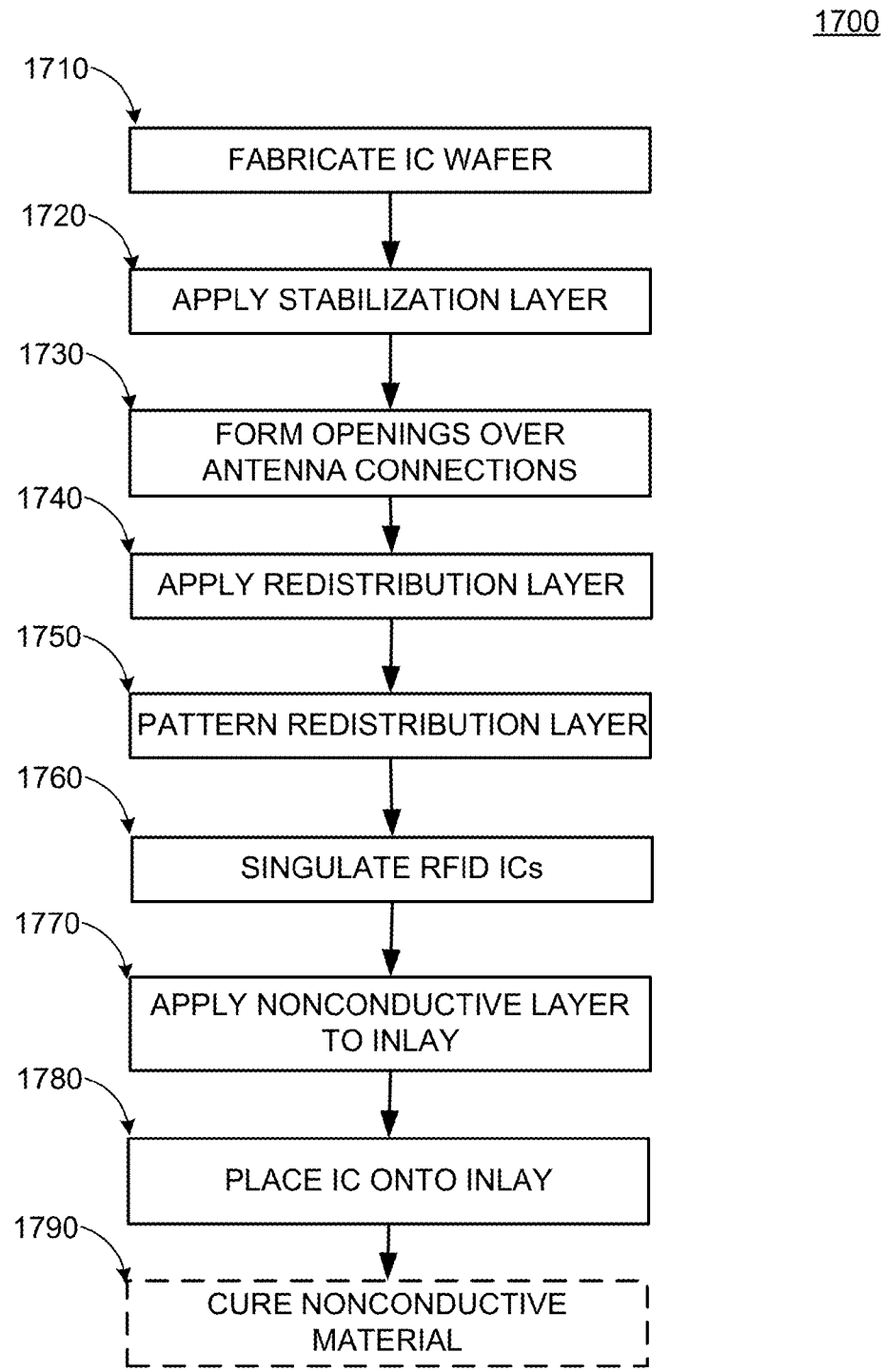
FIG. 17 is a flowchart for a process of fabricating an RFID tag with a stabilization layer, a conductive redistribution layer, and a nonconductive layer according to embodiments.

FIG. 17 is a flowchart for a process of fabricating an RFID tag with a stabilization layer, a conductive redistribution layer, and a nonconductive layer according to embodiments.

Operations 1710 through 1760 of process 1700 are substantially the same as similarly numbered operations 1510 through 1560 of process 1500. At operation 1770, a nonconductive layer is applied to the inlay instead of the anisotropic conductive layer of step 1570. As described above, this nonconductive material can provide capacitive coupling between an inlay antenna and the RFID IC. Operations 1780 and 1790 proceed similarly to operations 1580 and 1590.

Figure 18:
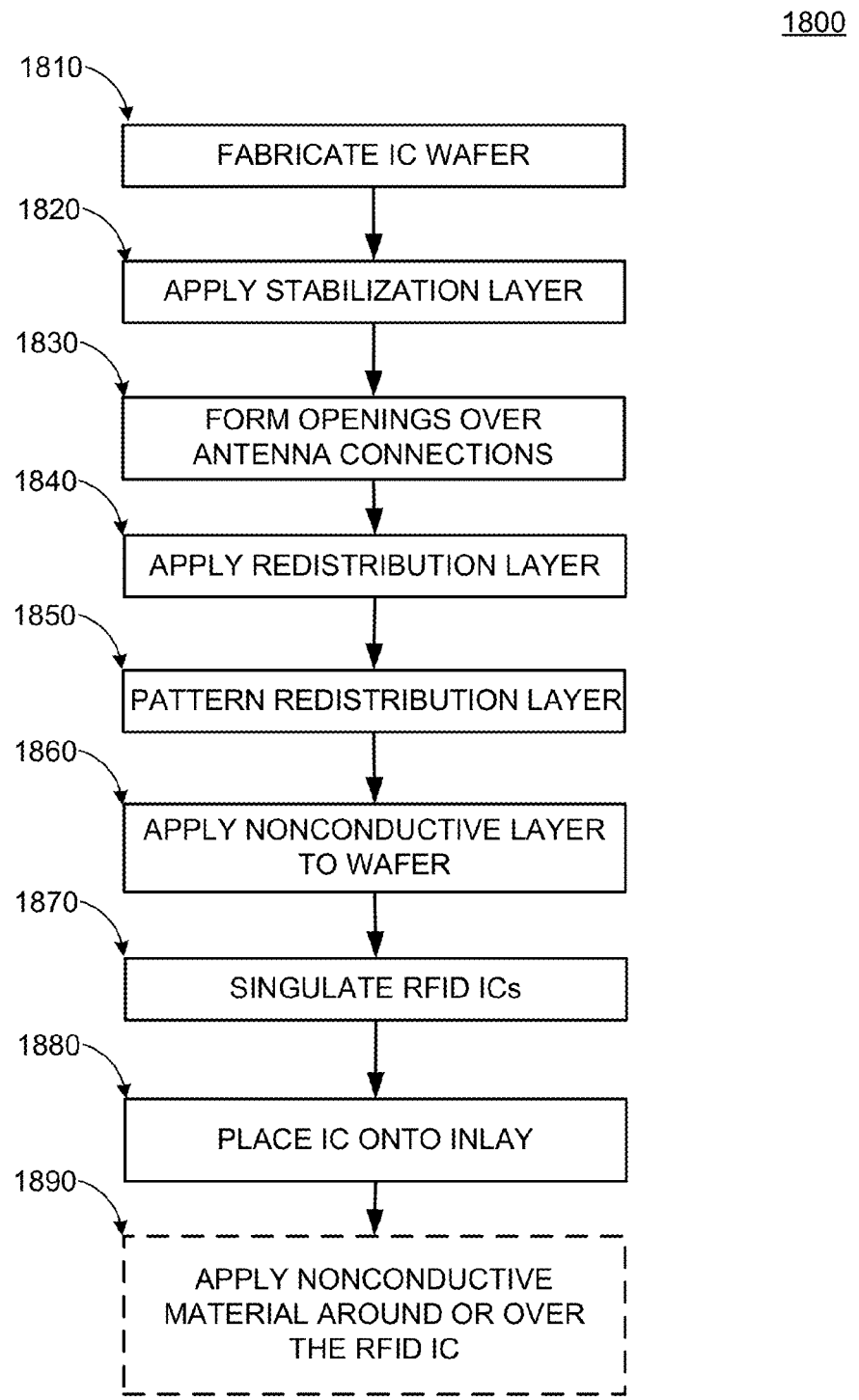
FIG. 18 is a flowchart for a process of fabricating an RFID tag with a stabilization layer, a conductive redistribution layer, and a nonconductive layer according to further embodiments.

FIG. 18 is a flowchart for a process of fabricating an RFID tag with a stabilization layer, a conductive redistribution layer, and a nonconductive layer according to further embodiments.

Operations 1810 through 1850 of process 1800 are substantially the same as similarly numbered operations 1610 through 1650 of process 1600. At operation 1860, a nonconductive layer is applied to the RFID IC instead of the anisotropic conductive layer of step 1660. As described above, this nonconductive material can provide capacitive coupling between an inlay antenna and the RFID IC. Operations 1870 and 1880 proceed similarly to operations 1670 and 1680. At operation 1890, a nonconductive material may be applied around or over the RFID IC to protect the RFID IC and/or to strengthen the bond between the RFID IC and the inlay.

The operations described in processes 1400 through 1800 are for illustration purposes only. An RFID IC and its inlay may be integrated employing additional or fewer operations and in different orders using the principles described herein. Of course an order of the operations may be modified, some operations eliminated, or other operations added according to other embodiments.

For example, while processes 1400 through 1800 are described for placing an RFID IC onto an inlay, the same processes may also be used for placing an RFID IC onto a strap (e.g., strap 300 in FIG. 3) with minimal modification. In embodiments where the RFID IC is placed onto a strap, additional steps may be required to fabricate an RFID tag from the IC-strap combination.

Figure 19:
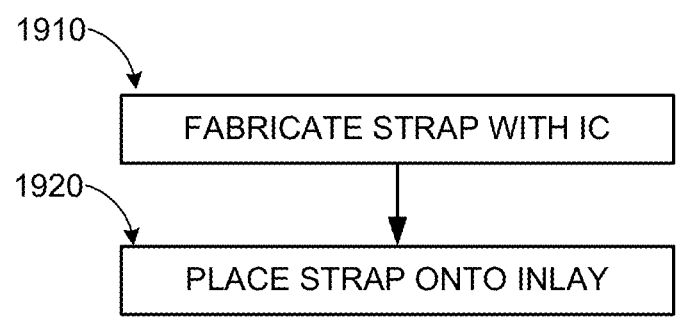
FIG. 19 is a flowchart for a process of fabricating an RFID tag with a strap and an inlay according to embodiments.

FIG. 19 is a flowchart for a process 1900 of fabricating an RFID tag with a strap and an inlay, according to further embodiments. In step 1910, a strap with an IC is fabricated, for example with one of processes 1400-1800, described above in relation to FIGS. 14-18. After the strap is fabricated, the strap is then placed onto the inlay in step 1920 such that the IC on the strap is electrically coupled to antenna segments on the inlay. The strap may be placed onto the inlay in a similar fashion to how an IC is placed onto the inlay (e.g., steps 1460, 1580, 1680, 1780, and 1880 in FIGS. 14-18, respectively). However, any other means for securing the strap to the inlay may be used. For example, the strap may be physically pressed onto the inlay, one or more interface layers may be used to attach the strap to the inlay, one or more adhesives may be used to attach the strap to the inlay, or any other suitable securing methods may be used. In certain embodiments, stabilization layers (e.g., layer 1110 in FIG. 11), conductive redistribution layers (e.g., layer 1212 in FIG. 12), anisotropic/patterned conductive layers, nonconductive layers, and/or any other suitable means may also be used to modulate the mounting capacitance between the IC-bearing strap and the inlay.

The foregoing detailed description has set forth various embodiments of the devices and/or processes via the use of block diagrams and/or examples. Insofar as such block diagrams and/or examples contain one or more functions and/or aspects, it will be understood by those within the art that each function and/or aspect within such block diagrams or examples may be implemented, according to embodiments formed, individually and/or collectively, by a wide range of hardware, software, firmware, or virtually any combination thereof.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, configurations, antennas, transmission lines, and the like, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). It will be further understood that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

We claim:

1. A Radio Frequency Identification (RFID) strap comprising:
   a strap substrate;
   a strap pad on the strap substrate; and
   an assembly including an RFID integrated circuit (IC) and a nonconductive organic stabilization layer, wherein
   the stabilization layer is deposited onto a surface of the IC;
   the stabilization layer is confined within a perimeter of the surface;
   an opening is formed in the stabilization layer;
   a conductive bump is formed in the opening;
   the assembly is subsequently mounted onto the strap substrate such that the bump forms an electrical connection between the IC and the strap pad; and
   the strap is mounted onto an inlay such that the strap pad electrically connects to an antenna of the inlay.

2. The RFID strap of claim 1, wherein the opening is formed one of before and after the bump is formed.

3. The RFID strap of claim 1, wherein an adhesive secures the assembly to the strap substrate.

4. The RFID strap of claim 1, wherein the assembly further includes a conductive redistribution layer at least partially covering the stabilization layer and electrically connected to the strap pad.

5. The RFID strap of claim 4, wherein the redistribution layer is electrically connected to the IC through the bump.

6. The RFID strap of claim 4, wherein one of an anisotropic conductive layer and a patterned isotropic conductive adhesive provides the electrical connection between the redistribution layer and the strap pad.

7. The RFID strap of claim 4, wherein a nonconductive layer provides a capacitive connection between the redistribution layer and the strap pad.

8. The RFID strap of claim 1, wherein nonconductive material is applied to one of: around and over the RFID IC following placement of the assembly onto the strap.

9. A method for a Radio Frequency Identification (RFID) strap comprising:
    forming a strap substrate including a strap pad;
    forming an assembly including an RFID integrated circuit (IC) and a nonconductive organic stabilization layer by:
    depositing the stabilization layer onto a surface of the IC such that the stabilization layer is confined within a perimeter of the surface;
    forming an opening in the stabilization layer; and forming a conductive bump in the opening;
    subsequently mounting the assembly onto the strap substrate such that the bump forms an electrical connection between the IC and the strap pad; and
    mounting the strap onto an inlay such that the strap pad electrically connects to an antenna of the inlay.

10. The method of claim 9, further comprising one of forming the bump before forming the opening and forming the bump after forming the opening.

11. The method of claim 9, further comprising securing the assembly to the strap substrate with an adhesive.

12. The method of claim 9, wherein forming the assembly further includes depositing a conductive redistribution layer at least partially covering the stabilization layer, wherein the redistribution layer is electrically connected to the strap pad.

13. The method of claim 12, further comprising electrically connecting the redistribution layer to the antenna pad with the bump.

14. The method of claim 12, wherein one of an anisotropic conductive layer and a patterned isotropic conductive adhesive provides the electrical connection between the redistribution layer and the strap pad.

15. The method of claim 12, wherein a nonconductive layer provides a capacitive connection between the redistribution layer and the strap pad.

16. The method of claim 9, further comprising applying a nonconductive material to one of: around and over the RFID IC following placement of the assembly onto the strap.

17. A Radio Frequency Identification (RFID) strap comprising:
    a strap substrate;
    a strap pad on the strap substrate; and
    an assembly including an RFID integrated circuit (IC) and a nonconductive organic stabilization layer wherein the stabilization layer is deposited onto a surface of the IC;
    the stabilization layer is confined within a perimeter of the surface;
    an opening is formed in the stabilization layer;
    a conductive redistribution layer is deposited onto the stabilization layer and electrically connected to the IC through the opening;
    the assembly is subsequently mounted onto the strap substrate such that the redistribution layer forms an electrical connection between the IC and the strap pad; and
    the strap is mounted onto an inlay such that the strap pad electrically connects to an antenna of the inlay.

18. The RFID strap of claim 17, wherein an adhesive secures the assembly to the strap substrate.

19. The RFID strap of claim 17, wherein one of an anisotropic conductive layer and a patterned isotropic conductive adhesive provides the electrical connection between the redistribution layer and the strap pad.

20. The RFID strap of claim 1, wherein nonconductive material is applied to one of: around and over the RFID IC following placement of the assembly onto the strap.

* * * * *